United States Patent
Seigler (10) Patent No.: US 7,656,700 B2
(45) Date of Patent: Feb. 2, 2010

(54) MAGNETORESISTIVE SENSOR MEMORY WITH MULTIFERROIC MATERIAL

(75) Inventor: Michael A. Seigler, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 241 days.

(21) Appl. No.: 11/856,217

(22) Filed: Sep. 17, 2007

(65) Prior Publication Data

US 2009/0073747 A1    Mar. 19, 2009

(51) Int. Cl.
*G11C 11/00* (2006.01)
(52) U.S. Cl. ..................... 365/157; 365/158
(58) Field of Classification Search ............... 365/157, 365/158, 171, 145
See application file for complete search history.

(56) References Cited

U.S. PATENT DOCUMENTS

| | | | | |
|---|---|---|---|---|
| 5,640,343 | A | 6/1997 | Gallagher et al. | 365/171 |
| 6,114,719 | A | 9/2000 | Dill et al. | 257/295 |
| 6,480,411 | B1 * | 11/2002 | Koganei | 365/158 |
| 2002/0071303 | A1 | 6/2002 | Kund et al. | 365/145 |
| 2004/0091744 | A1 | 5/2004 | Carey et al. | 428/693 |
| 2004/0145850 | A1 | 7/2004 | Fukumoto et al. | 361/143 |
| 2004/0183198 | A1 | 9/2004 | Andrei et al. | 257/758 |
| 2004/0257849 | A1 | 12/2004 | Jeong | 365/123 |
| 2005/0083743 | A1 | 4/2005 | Andrei et al. | 365/202 |
| 2005/0254288 | A1 | 11/2005 | Fukuzumi | 365/158 |
| 2005/0269612 | A1 | 12/2005 | Torok et al. | 257/295 |
| 2006/0011958 | A1 | 1/2006 | Jeong et al. | 257/295 |
| 2006/0097306 | A1 | 5/2006 | Kim et al. | 257/315 |
| 2006/0250840 | A1 | 11/2006 | Zheng et al. | 365/171 |
| 2006/0256485 | A1 | 11/2006 | Seigler et al. | 160/324.12 |
| 2007/0189064 | A1 | 8/2007 | Min et al. | 365/158 |
| 2007/0285184 | A1 * | 12/2007 | Eyckmans et al. | 331/107 R |

FOREIGN PATENT DOCUMENTS

| | | |
|---|---|---|
| GB | 2422735 | 8/2006 |
| WO | WO 2007/075889 | 7/2007 |
| WO | WO-2007/099277 | * 9/2007 |

OTHER PUBLICATIONS

Singapore Search Report for application No. SG200806851-2, mailed Mar. 6, 2009; filed Sep. 16, 2008; 6 pages.
"Polarization Switching in Epitaxial BiFe0₃ Films", by F. Zavaliche et al., *Applied Physics Letters*, 87, (2005), pp. 252902-1-252902-3.
"Tunneling Across a Ferroelectric", by E. Tsymbal et al., *Science*, vol. 313, Jul. 14, 2006, pp. 181-183.
"Ferroelectric Switch for Spin Injection", by N. Zhuravlev, *Applied Physics Letters*, 87, (2005), pp. 222114-1-222114-3.

* cited by examiner

*Primary Examiner*—Vu A Le
(74) *Attorney, Agent, or Firm*—David C. Bohn; Westman, Champlin & Kelly, P.A.

(57) ABSTRACT

A memory cell includes a magnetoresistive sensor that comprises layers that include a free layer. The magnetoresistive sensor conducts a read current representative of data stored in the memory cell during a read interval. A first write conductor carries a write current that writes data in the free layer. At least one of the layers comprises a multiferroic layer formed of multiferroic material.

24 Claims, 8 Drawing Sheets

MAGNETORESISTIVE SENSOR MEMORY WITH MULTIFERROIC MATERIAL

FIELD OF THE INVENTION

The present invention relates generally to data memory, and more particularly but not by limitation to non-volatile data memory.

BACKGROUND OF THE INVENTION

Existing solid state non-volatile memory devices such as MRAM, flash memory, spin RAM have limited size (in comparison with disc drives) and have practical performance limits in terms of long term non-volatility or in terms of memory size. One technical difficulty with MRAM in particular is the difficulty of writing to one selected memory cell at a cross point without unduly exposing other memory cells in the same row or column as the selected memory cell to enough stray magnetic field to cause a stray write, in other words, a write error.

Improvements are needed in the ability to write to a selected memory cell while maintaining high noise margins for other memory cells on the same row or same column as the selected memory cell.

Various aspects of the present invention provide solutions to these and other problems, and offer other advantages over the prior art.

SUMMARY OF THE INVENTION

Described below are aspects of an array of memory cells. The array of memory cells comprises at least row write conductors. Each memory cell comprises a magnetoresistive sensor that comprises layers that include a free layer. During a read interval the magnetoresistive sensor conducts a read current representative of data stored in the memory cell. During a write interval, a write current writes data in the magnetoresistive sensor. At least one of the layers comprises a multiferroic layer formed of multiferroic material.

According to one aspect, the multiferroic material receives a modulation potential that modulates magnetic anisotropy of the multiferroic material. According to another aspect, the modulation provides a relatively lower magnetic anisotropy during a write interval and a relatively higher magnetic anisotropy during a read interval. According to yet another aspect, a free layer in the magnetoresistive sensor comprises the multiferroic material.

Other features and benefits that characterize aspects of the present invention will be apparent upon reading the following detailed description and review of the associated drawings.

DETAILED DESCRIPTION OF ILLUSTRATIVE EMBODIMENTS

According to one aspect an array of memory cells comprises row write conductors and column conductors that cross. The row conductors cross the column conductors at cross points. Memory cells are located between the row and column conductors at the cross points. Individual memory cells are addressable at the cross points. Each memory cell comprises a magnetoresistive sensor that includes a layer of multiferroic material. The multiferroic material receives a modulation potential that modulates the magnetic anisotropy of the multiferroic material. The modulation provides a lower magnetic anisotropy during a write interval. In another aspect, magnetic anisotropy can also be increased during a read interval. In yet another aspect, a free layer in the magnetoresistive sensor comprises the multiferroic material.

As used in this application, the term "multiferroic material" refers to a material that has both piezoelectric and ferromagnetic properties. Of particular interest are multiferroic materials in which the amplitude of an applied electric field changes the magnitude of a ferromagnetic property. A voltage applied to a layer of multiferroic material can have its amplitude modulated to modulate the magnetic anisotropy (or in a few cases, magnetic moment) of the multiferroic material. The multiferroic material can be included in one or more free layers of a magnetoresistive sensor, or in other layers of the magnetoresistive sensor. The use of multiferroic material in a layer of a magnetoresistive sensor allows a magnetic property of the layer to be changed by changing a voltage. The magnetic material property can, for example, take on one magnitude or direction during a write interval and a different magnitude or direction during a read interval.

As used in this application, the term "magnetoresistive sensor" refers to magnetic sensors such as tunnel junctions, spin valves, anisotropic magnetoresistive (AMR) sensors, extraordinary Hall effect sensors and the like.

As used in this application, the term "tunnel junction" refers to a stack of layers that includes one or more free layers and any adjacent layers included in the design such as, but not limited to, magnetic biasing layers and barrier layers.

In addition, tunnel junctions may include additional layers that include but are not limited to seed layers that facilitate application of other layers and multilayer synthetic antiferromagnetic (SAF) layers. A SAF typically includes a ferromagnetic layer (such as a reference layer), a spacer layer, a second ferromagnetic layer (such as a pinned layer) and an optional pinning layer. A SAF includes two ferromagnetic layers separated by a nonmagnetic spacer layer such that the two ferromagnetic layers are antiferromagnetically coupled to one another.

As used in this application, "free layer" refers to a layer that comprises a magnetic material with a magnetization direction that is free to rotate under the influence of an applied magnetic field. An applied magnetic field during a WRITE operation, for example, reverses the magnetic moment of a free layer. The reversal of the magnetic moment induces a change of electrical resistance of the magnetic sensor.

As used in this application, "bias layer" refers to an optional layer that provides a magnetic field that shifts or rotates an initial magnetic condition of a free layer. A variety of bias arrangements can be used such as hard biasing (permanent magnets), shunt biasing, soft adjacent layer (SAL)

biasing, barber pole biasing, dual striped biasing, pinning and pinned layers, or other known magnetic biasing techniques.

As used in this application, "barrier layer" refers to a non-conductive layer that provides a high resistance barrier to flow of electrical current between adjacent ferromagnetic layers. A barrier layer is sufficiently thin that quantum mechanical tunneling of charge carriers occurs between the adjacent ferromagnetic layers. The tunneling process is spin dependent, which means that the tunneling current across the junction depends on the spin-dependent electronic properties of the adjacent ferromagnetic layers and is a function of the relative orientation of the magnetization directions of the two adjacent ferromagnetic layers.

Figures 1A, 1B, 1C:
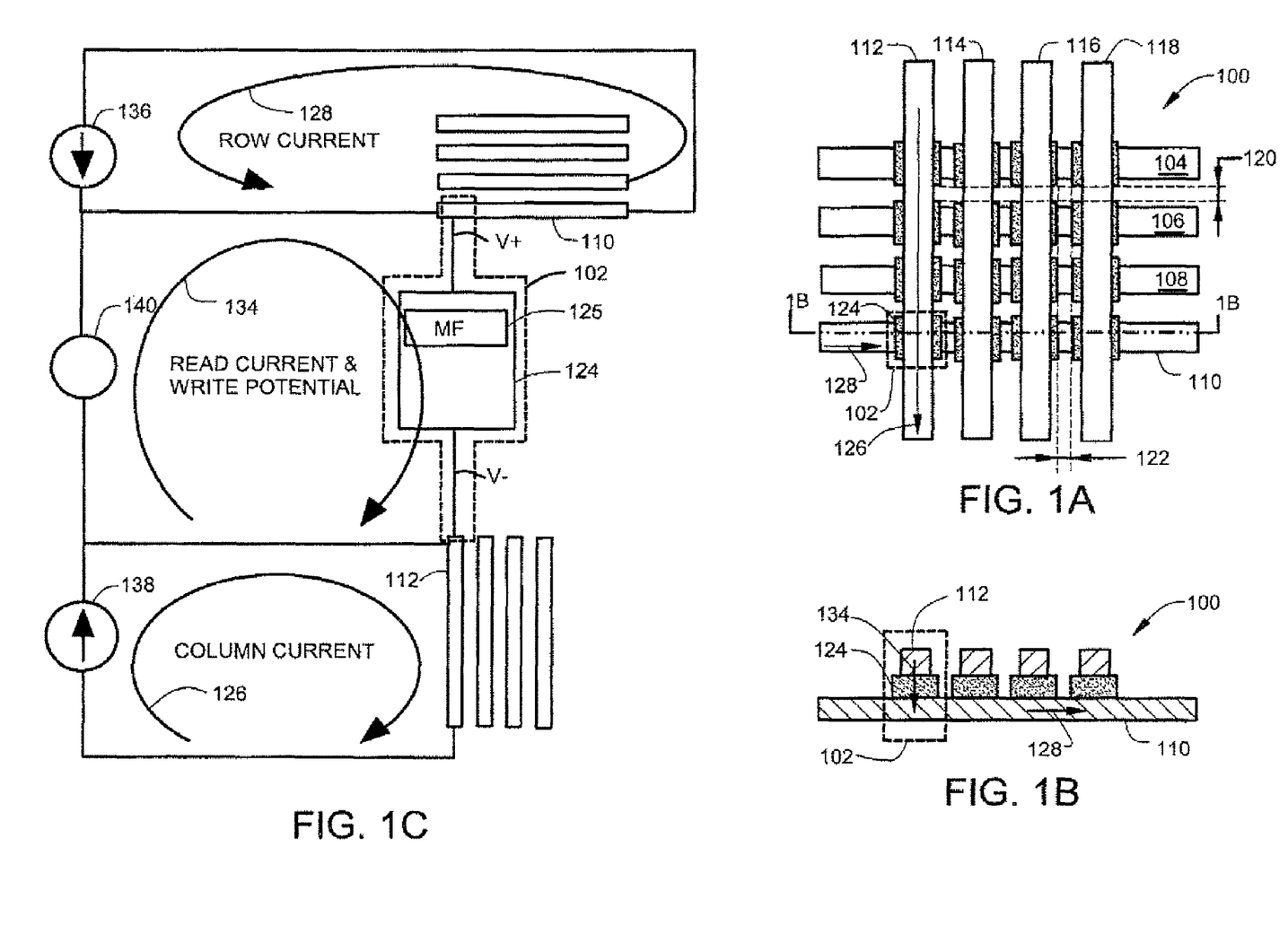
FIGS. 1A, 1B, 1C, 1D illustrate aspects of a first multiferroic random access memory (MFRAM) array of memory cells.
Figure 1D:
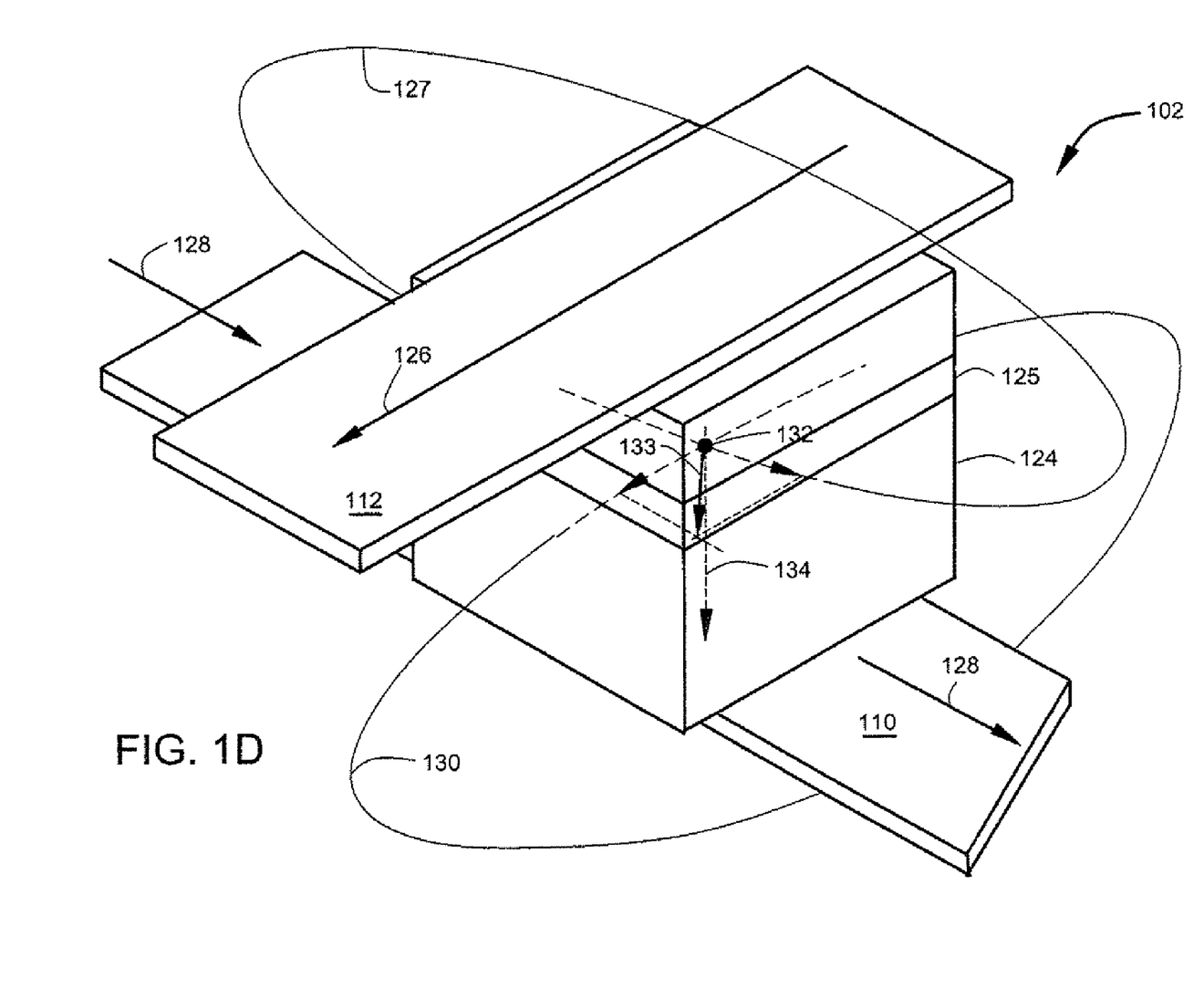

FIGS. 1A, 1B, 1C, 1D illustrate aspects of a first multiferroic random access memory (MFRAM) array of memory cells 100 such as a representative memory cell 102. FIG. 1A illustrates a top view of the array of the memory cells 100. FIG. 1B illustrates a front cross-sectional view (along section line 1B-1B in FIG. 1A) of the array of the memory cells 100. FIG. 1C illustrates a simplified electrical schematic of connections from memory cell 102 to external driving and sensing circuits when the memory cell 102 is addressed. FIG. 1D illustrates an oblique view of the memory cell 102. It is understood that the array of the memory cells 100, while illustrated with 16 memory cells, typically includes a much larger number of memory cells. It is understood that the memory cell 102 is representative of all of the memory cells in the array of the memory cells 100. Descriptions of features of the memory cell 102 also apply to other memory cells in the array of memory cells 100.

In FIG. 1A, write conductors 104, 106, 108, 110 are arranged in rows on one side of the array of memory cells 100. Write conductors 112, 114, 116, 118 are arranged in columns on a second opposite side of the array 100 of memory cells. The array of memory cells 100 comprises a rectangular array of memory cells in rows and columns. The memory cells 100 are separated from one another by row spaces and column spaces (such as a row space 120 and a column space 122). In one aspect, row spaces and column spaces are filled with electrical insulation material (not illustrated) such as alumina. The row spaces and column spaces are sufficiently wide to provide adequate electrical and magnetic isolation between the memory cells.

As illustrated in FIGS. 1A, 1B, 1C, 1D, memory cell 102 includes a magnetoresistive sensor 124. The magnetoresistive sensor 124 includes a multiferroic (MF) element 125 (FIGS. 1C, 1D). The magnetoresistive sensor 124 is electrically connected to write conductors 110, 112 that cross one another at cell 102. The write conductors 110, 112 provide electrical connections (contact layers) to the magnetoresistive sensor 124. During a read time interval, a read current 134 flows through the magnetoresistive sensor 124. During a write time interval, the write conductors 110, 112 carry write currents along their lengths that provide magnetic fields (such as magnetic fields 127, 130 illustrated in FIG. 1D) to the magnetoresistive sensor 124. During the write time interval, the conductors 110, 112 also provide a write potential (V+, V−) to the magnetoresistive sensor 124. The write potential modulates the magnetic anisotropy of the multiferroic layer 125.

The cell 102 can be addressed for writing by passing write currents 126, 128 through the write conductors 110, 112 that cross in the cell 102, and by applying the write potential (V+, V−) to the magnetoresistive sensor 124. As best seen in FIG. 1D, the write current 126 flowing along the write conductor 112 generates a magnetic field component 127. The write current 128 flowing along write conductor 110 generates a magnetic field component 130. Internal to the magnetoresistive sensor 124, at a representative internal location 132, magnetic field components 127, 130 are approximately transverse to one another as illustrated in FIG. 1D. The magnetic field components 127, 130 add vectorially at internal location 132 to provide a net magnetic field 133 that is larger than either magnetic field component 127 or magnetic field component 130.

FIG. 1C schematically illustrates the circuit paths of the (row) write current is 128 and the (column) write current 126 when cell 102 is selected for writing. FIG. 1C schematically illustrates the circuit path of the read current 134 when cell 102 is selected for reading. Current source 136 provides the row write current 128. Current source 138 provides the column write current 126. Potential source 140 provides both the read current 134 and the write potential (V+, V−). The cell 102 is selected (addressed) for read or write access by the use of solid state switches (not illustrated in FIG. 1C) to select the row and column conductors 110, 112 that cross in the cell 102.

Figure 2A:
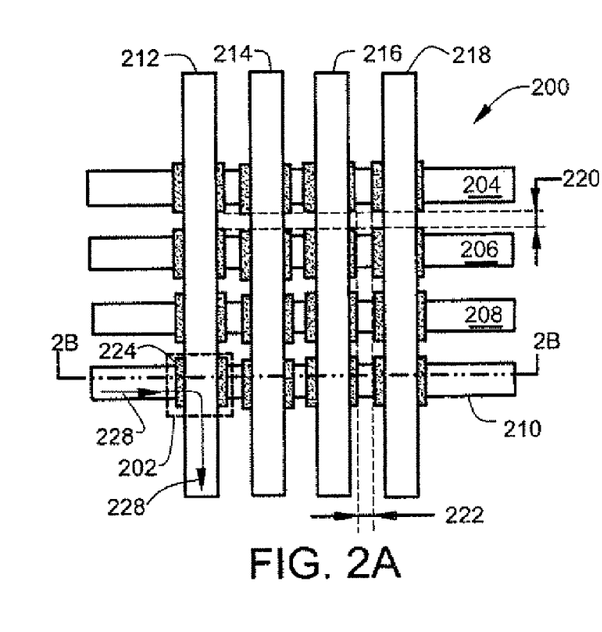
FIGS. 2A, 2B, 2C, 2D illustrate aspects of a second multiferroic random access memory (MFRAM) array of memory cells such.
Figure 2B:
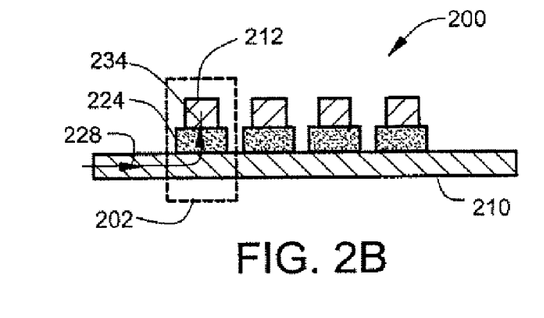
Figure 2C:
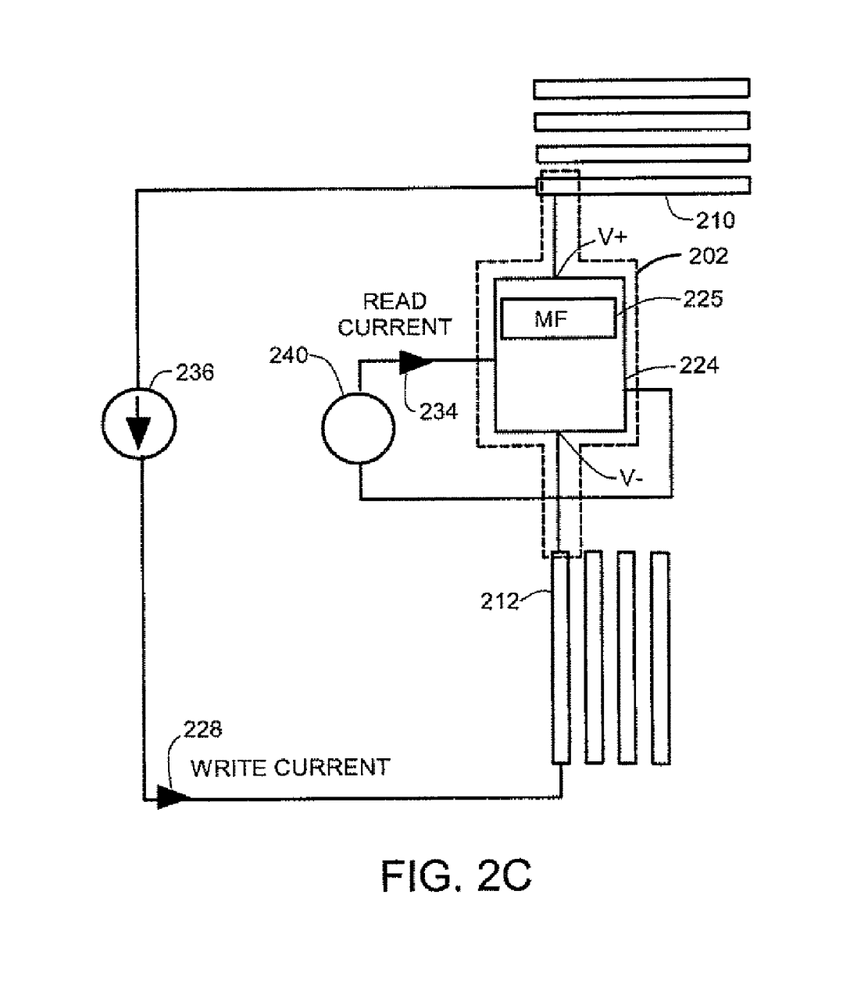
Figure 2D:
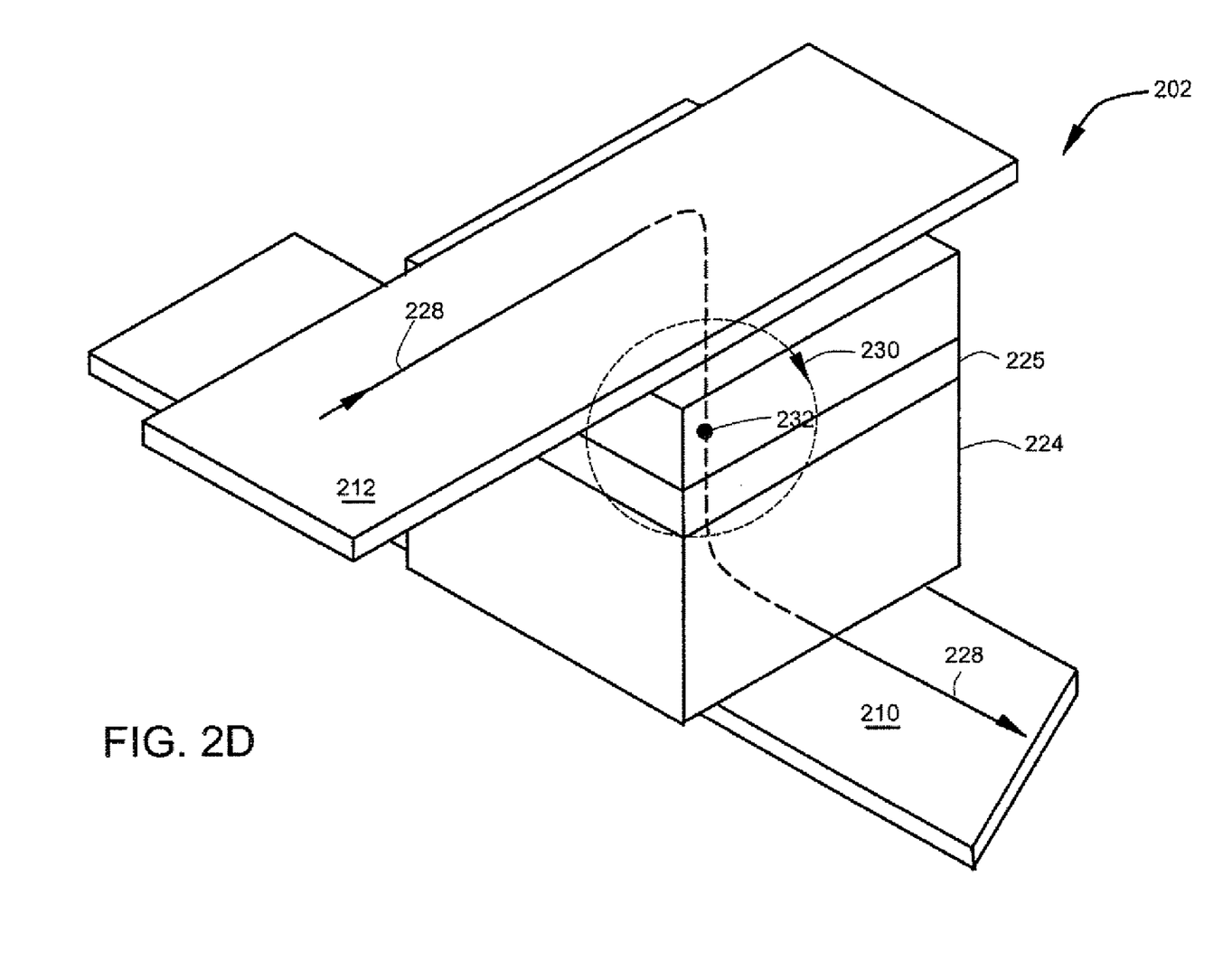

FIGS. 2A, 2B, 2C, 2D illustrate aspects of a second multiferroic random access memory (MFRAM) array 200 of memory cells such as a representative memory cell 202. FIG. 2A illustrates a top view of the array of the memory cells 200. FIG. 2B illustrates a front cross-sectional view (along section line 2B-2B in FIG. 2A) of the array of the memory cells 200. FIG. 2C illustrates a simplified electrical schematic of connections from representative memory cell 202 to external driving and sensing circuits. FIG. 2D illustrates an oblique view of the memory cell 202. It is understood that the array of memory cells 200, while illustrated with 16 memory cells, typically has a much larger number of memory cells. It is understood that the memory cell 202 is representative of all of the memory cells in the array of memory cells 200. Descriptions of features of memory cell 202 also apply to other memory cells in the array of memory cells 200.

In FIG. 2A, write conductors 204, 206, 208, 210 are arranged in rows on one side of the array of memory cells 200. Write conductors 212, 214, 216, 218 are arranged in columns on a second opposite side of the array 200 of memory cells. The array of memory cells 200 comprises a rectangular array of memory cells in rows and columns. The memory cells 200 are separated from one another by row spaces and column spaces (such as row space 220 and column space 222). In one aspect, row spaces and column spaces are filled with electrical insulation material (not illustrated) such as alumina. The row spaces and column spaces are sufficiently wide to provide adequate electrical and magnetic isolation between the memory cells. The row and column spaces are also used for an array of row and column read conductors (not illustrated in FIGS. 2A, 2B, 2D).

As illustrated in FIGS. 2A, 2B, 2C, 2D, each of the cells (such as cell 202) includes a magnetoresistive sensor 224. The magnetoresistive sensor 224 includes a multiferroic element 225. The magnetoresistive sensor 224 is electrically connected to write conductors 210, 212 that cross one another at cell 202. The write conductors 210, 212 provide electrical connections (contact layers) to the magnetoresistive sensor 224 for conducting a write current 228 through the magnetoresistive sensor 224. The write conductors 210, 212 carry the write current 228 to the magnetoresistive sensor 224. The write current 228 flows through the magnetoresistive sensor 224 to provide a magnetic field 230 internal to the magnetoresistive sensors 200.

The cell 202 can be addressed for writing by passing the write current 228 through the write conductors 210, 212 that cross in the cell 202. FIG. 2C schematically illustrates the write current 228, when cell 202 is selected by for writing.

The write current 228 generates a write potential (V+, V−) across the magnetoresistive sensor 224. The write potential (V+, V−) modulates the magnetic anisoptropy (or other magnetic property) of the multiferroic layer 225. FIG. 2C illustrates the read current 234 when cell 202 is selected for reading. Current source 236 provides the write current 228. Potential source 240 provides the read current 234. The cell 202 is selected (addressed) for write access by the use of solid state switches (not illustrated in FIG. 2C) to select the row and column conductors 210, 212 that cross in the cell 202. The cell 202 is selected (addressed) for read access by use of solid state switches (not illustrated in FIG. 2C) to select row and column read conductors that connect between the cell 202 and the potential source 240.

Figure 3:
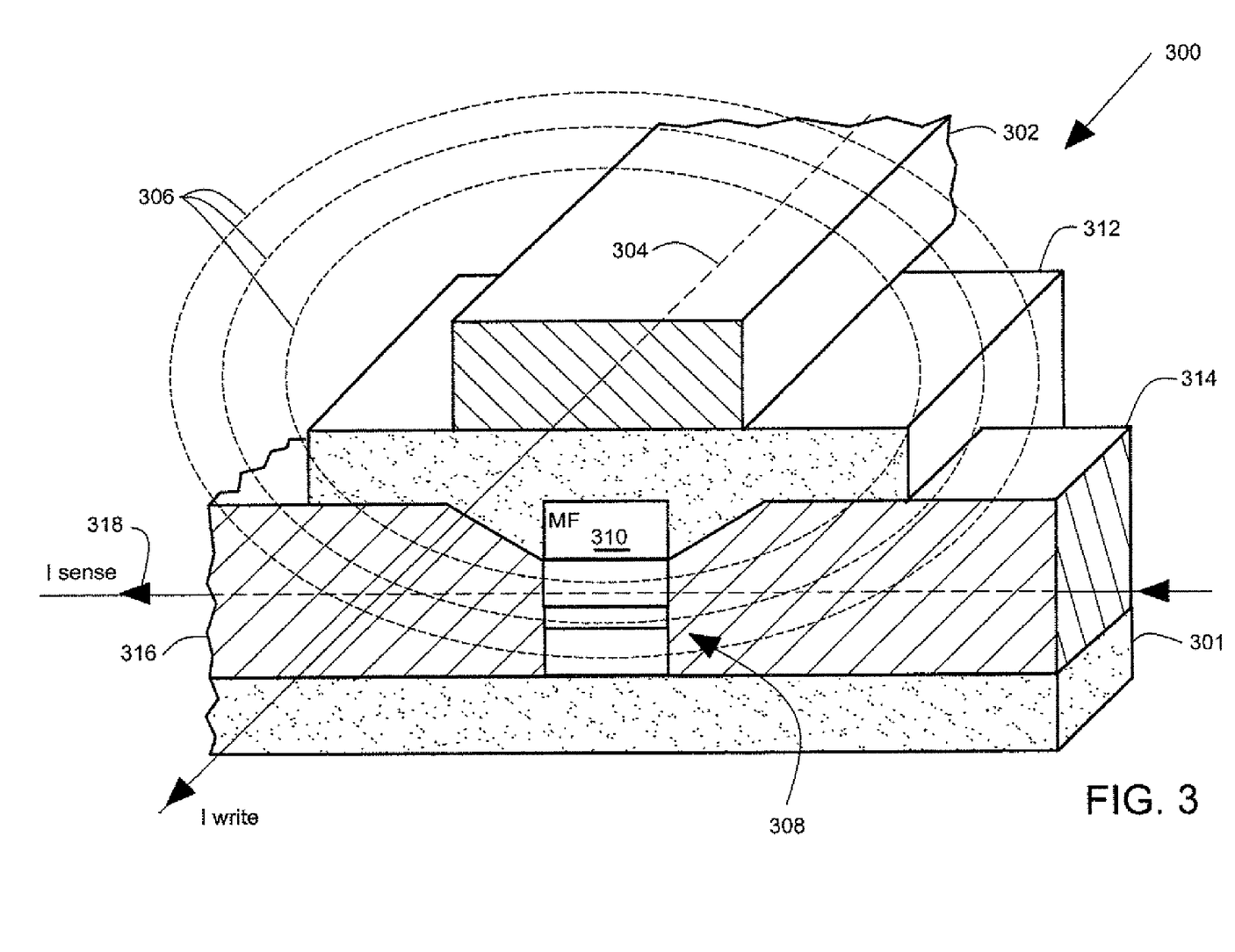
FIG. 3 illustrates aspects of a first memory cell that includes multiferroic material.

FIG. 3 illustrates aspects of a first memory cell 300 that includes multiferroic material. The memory cell 300 is supported on a substrate 301. The memory cell 300 comprises a write conductor 302. The write conductor 302 carries a write current 304 during a write time interval. The write current 304 generates a magnetic field 306. The magnetic field 306 passes through a magnetoresistive sensor 308. The magnetoresistive sensor 308 includes a multiferroic layer 310. An insulation layer 312 separates the multiferroic layer 310 from the write conductor 302. The memory cell 300 includes electrical contact layers 314, 316. The electrical contact layers 314, 316 contact the magnetoresistive sensor 308. During a read interval, a sense current 318 flows through the contact layer 314, the magnetoresistive sensor 308 and the contact layer 316. During a write interval a write potential is applied to the multiferroic layer 310 by the contact layers 314, 316 and 302. The write potential modulates a magnetic property of the multiferroic layer 310. In one aspect, the magnetoresistive sensor 308 comprises a spin valve. The writing can either be via a magnetic field created by the current (as illustrated) or it can be due to spin momentum transfer from the write current (not illustrated).

Figure 4:
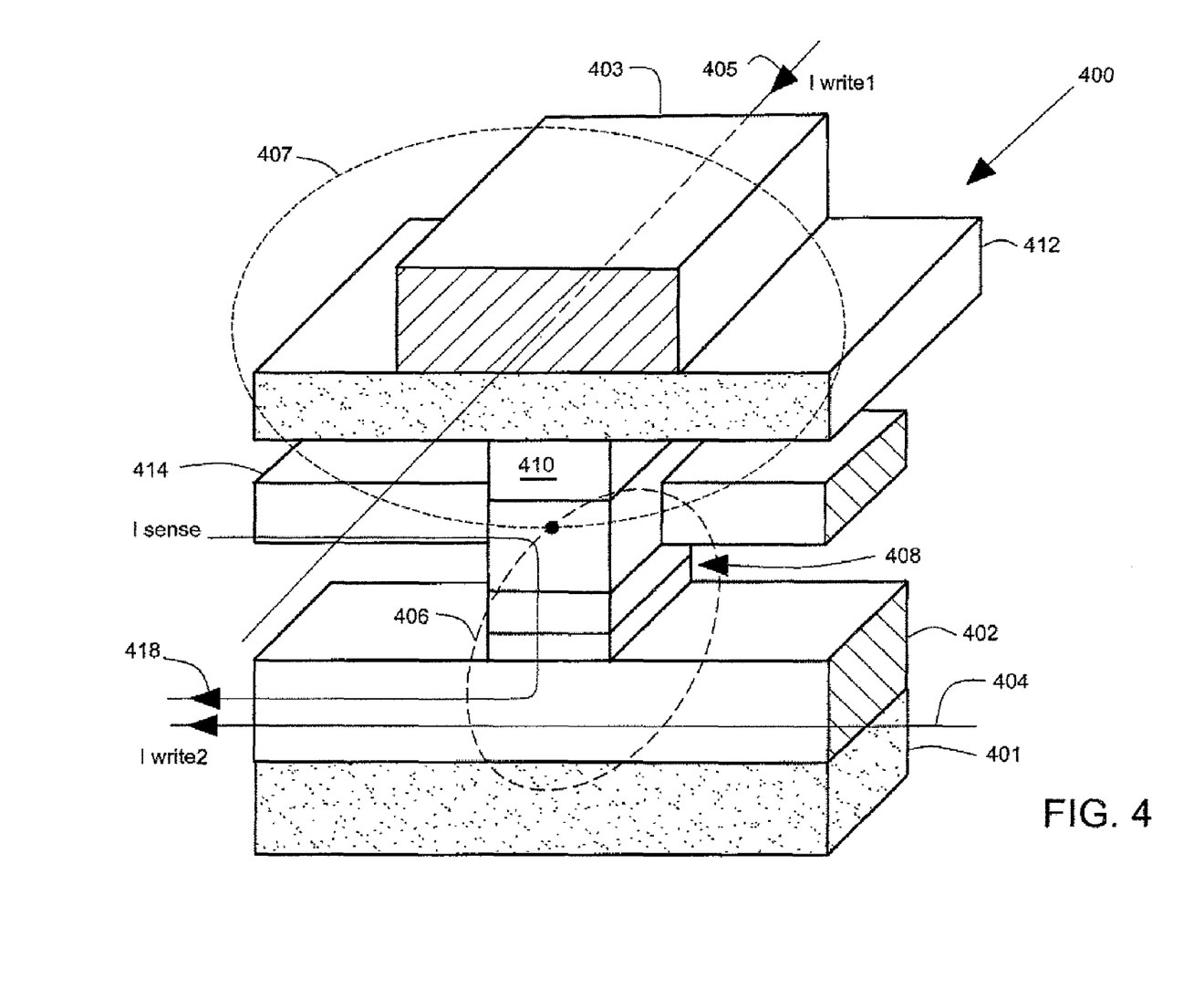
FIG. 4 illustrates aspects of a second memory cell that includes multiferroic material.

FIG. 4 illustrates aspects of a second memory cell 400 that includes multiferroic material. The memory cell 400 is supported on a substrate 401. The memory cell 400 comprises write conductors 402, 403. The write conductor 402 carries a write current 404 (I write2) during a write time interval. The write conductor 403 carries a write current 405 (I write1) during the write interval. The write current 404 generates a magnetic field 406. The write current 405 generates a magnetic field 407. The magnetic fields 406, 407 passes through a magnetoresistive sensor 408. The magnetoresistive sensor 408 includes a multiferroic layer 410. An insulation layer 412 separates the multiferroic layer 410 from the write conductor 403. The memory cell 400 includes a sense contact layer 414 that contacts the magnetoresistive sensor 408. During a read interval, a sense current (I sense) 418 flows through the contact layer 414, the magnetoresistive sensor 408 and the write conductor 402. During a write interval, a write potential is applied to the multiferroic layer 410 by the contact layers 414 and the write conductor 418. The write potential modulates a magnetic property of the multiferroic layer 410. In one aspect, the magnetoresistive sensor 408 comprises a spin valve. The writing can either be via a magnetic field created by the current (as illustrated) or it can be due to spin momentum transfer from the write current (not illustrated).

Figure 5:
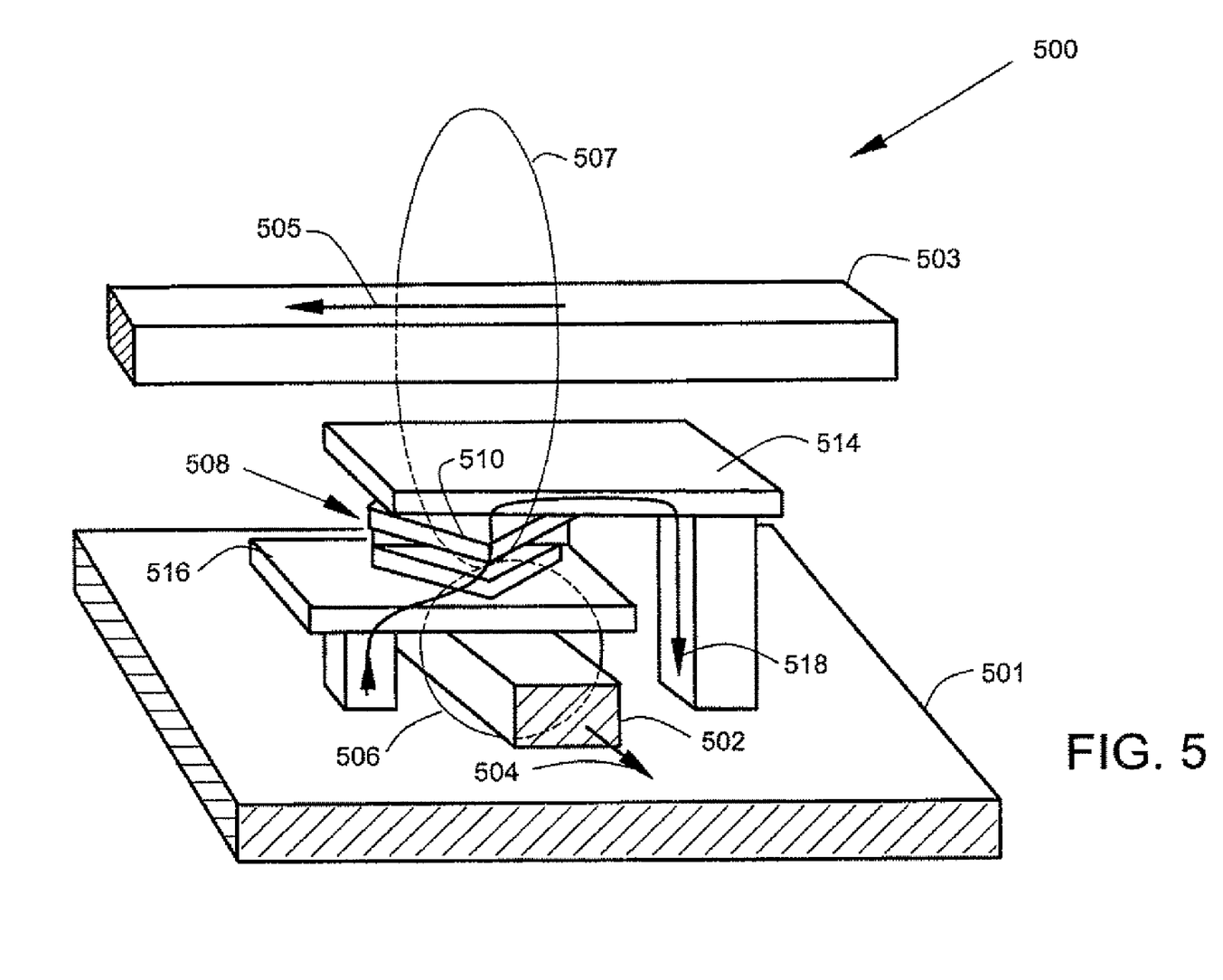
FIG. 5 illustrates aspects of a third memory cell that includes multiferroic material.

FIG. 5 illustrates aspects of a third memory cell 500 that includes multiferroic material. The memory cell 500 is supported on a substrate 501. The memory cell 500 comprises write conductors 502, 503. The write conductor 502 carries a write current 504 during a write time interval. The write conductor 503 carries a write current 505 during the write interval. The write current 504 generates a magnetic field 506. The write current 505 generates a magnetic field 507. The magnetic fields 506, 507 passes through a magnetoresistive sensor 508. The magnetoresistive sensor 508 includes a multiferroic layer 510. An insulation layer (not illustrated in FIG. 5) separates a contact layer 514 from the write conductor 503. The memory cell 500 includes sense contact layers 514, 516 that contact the magnetoresistive sensor 508. The writing can either be via a magnetic field created by the current (as illustrated) or it can be due to spin momentum transfer from the write current (not illustrated). During a read interval, a sense current 518 flows through the contact layer 514, the magnetoresistive sensor 508 and the contact layer 516. During a write interval, a write potential is applied to the multiferroic layer 510 by the contact layers 514, 516. The write potential modulates a magnetic property of the multiferroic layer 510. Contact layers 514 and 516 or, alternatively, write conductors 502 and 503 can be used to apply the potential. Contact layers 514 and 516 can also be used to write the bit via spin momentum transfer. Spin momentum transfer could be used if a current is flowing through the free layer of the memory device.

Figure 6A:
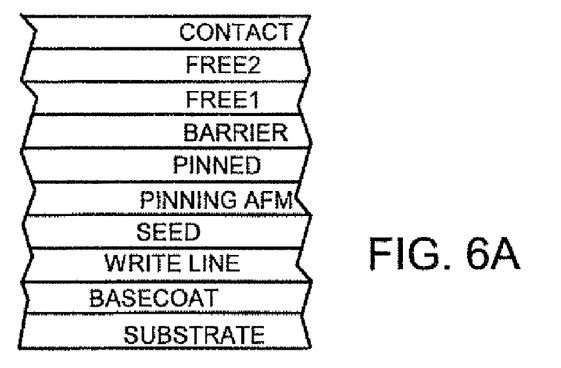
FIGS. 6A, 6B, 6C illustrate aspects of stacks of layers in memory cells that include multiferroic material.
Figure 6B:
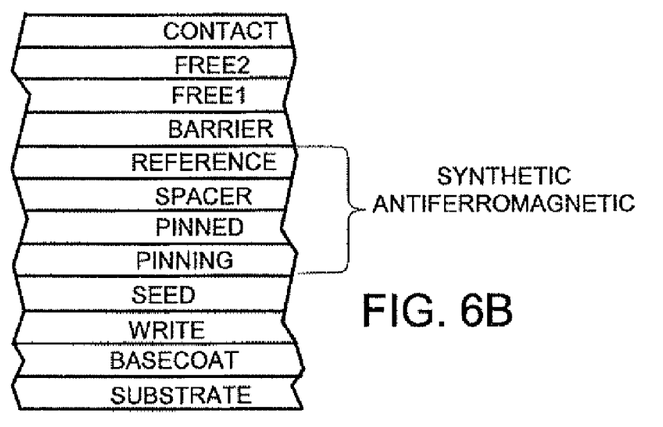
Figure 6C:
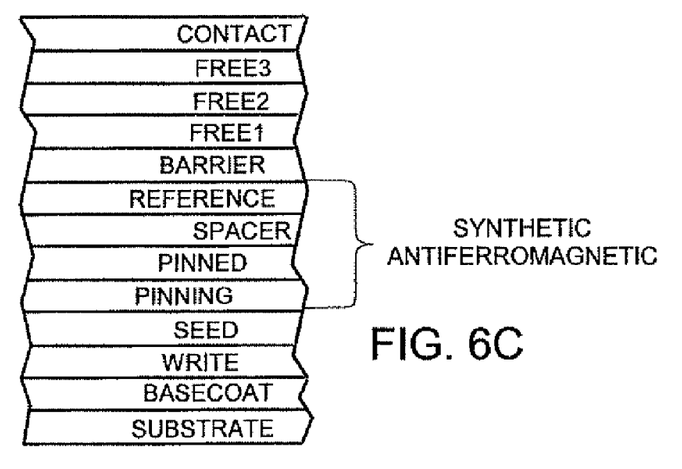

FIGS. 6A, 6B, 6C illustrate type examples of stacks of layers in memory cells. The examples shown in FIGS. 6A, 6B, 6C are not limiting, and other stacks of layers can be used as well. In each of FIGS. 6A, 6B, 6C, one of the ferromagnetic layers in the stack comprises a multiferroic material that has a magnetic property that is electrically modulated by the application of a voltage to the multiferroic layer. In one aspect, a free layer (or free layers) include a multiferroic material, and during a write interval, the magnetic anisotropy of the multiferroic material is modulated to reduce magnetic anisotropy. The solid state memory cells and memory arrays described above in connection with FIGS. 1-6 provide nonvolatile data storage that can store as much data as or more data than existing flash memory, MRAM or Spin RAM devices. A multiferroic (MF) material can be used as the storage layer (e.g., free layer) in a solid state memory device with a solid state addressable array architecture.

Processes for making the addressable array with multiferroic material are adaptable from existing processes used to make MRAM and Spin RAM devices which have not taken advantage of multiferroic material properties. The advantages of MRAM and Spin RAM, such as fast write times, unlimited write cycles and lower power, are preserved in the presently disclosed multiferroic random access memory (MFRAM) devices and arrays.

In existing MRAM devices, bits are written by applying a magnetic field to a free layer (FL) of a magnetic tunnel junction (MTJ) using crossed lead addressing. The FL is free enough to be rotated by the applied field, but stable enough to be thermally stable over long enough periods to be considered nonvolatile. The field from each lead is applied to all the devices in a row/column, which causes a stability issue for the other devices under that lead. The only bit that is written is where the bottom and top leads cross and the fields from the leads add together. Applying a current to create a field large enough to switch the FL also takes considerable power. The presently disclosed devices helps solve these issues. In the presently disclosed devices (e.g., FIGS. 1-6), the multiferroic material has a magnetic anisotropy that is modulated by an applied voltage. The voltage controls the magnetic anisotropy to have a smaller magnitude for the cell that is being written while other cells on the same row and column have larger magnetic anisotropy.

In existing SpinRAM device concepts, bits are written by applying a current through a single device. This has the advantage of addressing only one device at a time, but either a large current density is needed to switch the FL or the FL needs to have a low enough anisotropy to be switched by a low current density. The presently disclosed devices helps solve these issues. In the presently disclosed devices (e.g., FIGS. 2A, 2B, 2C, 2D), multiferroic material has a magnetic anisotropy that is modulated by an applied voltage. The voltage controls the magnetic anisotropy to have a smaller magnitude for the cell that is being written while other cells on the same row and column have larger magnetic anisotropy.

A multiferroic (MF) material can be part of a free layer, so that the coercivity of the FL is too high to be switched (or made unstable) by the magnetic field from the write current or currents, except in the one cell where a voltage is applied across the MF FL to lower the anisotropy. The voltage is primarily applied only across the FL of the one cell where the two leads cross. There can be some weaker fringing electric fields applied to non-addressed cells, but these fields are significantly lower than the electric field dropped across the FL of the cell being addressed. The multiferroic cell retains the advantages of SpinRAM over MRAM in terms of addressability. The multiferroic cell (FIG. 2A, 2B, 2C, 2D has the advantage that the switching is assisted by a voltage, not by a current lowering power requirements. The leads for the equivalent MRAM device would have a DC offset between them and this DC offset (e.g., from potential source 140 in FIG. 1C or potential source 240 in FIG. 2C) is substantially the voltage that is applied across the MF FL. The MFRAM cell using addressing similar to SpinRAM addressing has the tunnel junction (MTJ) stack engineered so that a voltage is dropped across the MF FL to reduce its anisotropy.

In both of the above cases, the MF FL can be magnetically coupled to another magnetic material in order to enhance the large magnetoresistance (MR) of the MTJ. The MF material can have a very high resistivity by combining high resistivity ferroelectrics and ferrites or by multilayering high resistivity ferroelectrics with metallic magnetostrictive materials (MSM), or the MF material can have a low resistivity by building a pillar like structure with a metallic MSM.

Ideally, the MF material could be placed in series with the MTJ by coupling 20 it directly to the FL. This requires a MF material with a low resistivity (relative to the RA of the MTJ) and a large magnetoelectric coupling (a small electric field causes a large change in magnetic anisotropy). In applications where it is desirable that the MF material not be disposed in the direct path of the current passing through the MTJ, the alternative structures described below can be used.

The multiferroic material can be used in a current-in-plane (CIP) magnetoresistive sensor instead of a current-perpendicular-to-plane (CPP) magnetoresistive sensor. This places the sensor in the I_sense line of FIG. 5. The write current would not need to pass through the MF FL. Write line 2 in FIG. 5 is an optional feature, since the use of the multiferroic material permits writing with only write line 1. The MF FL can be on top of the sensor device, such that a field could be applied between I_sense and Write Line 1, which lowers the anisotropy of the MF FL, and then the current in Write Line 1 could write the data. CIP sensors are more easily manufactured, and it has been shown that large sheet resistance, large MR devices are achievable.

The switching of the FL could be done by permanent magnets (PM) that are located on the sides of the sensor, much like magnetic tunnel junction read sensors in use today. The magnetization of these PMs can be switched using the write lines. The PMs can comprise a MF layer coupled to a soft magnetic material layer. The applied electric field lowers the anisotropy of the MF, allowing the soft magnetic and MF to be switched. The soft magnetic material is not always needed, but it may be desired to help control the magnetics and to apply a large magnetic field to the FL to make it very stable.

The device can alternatively be built similar to that described in the paragraph above, but there can be direct coupling (not just magnetostatic coupling) between the MF and the FL. Again, this coupling can be mediated via a second/soft magnetic material if desired. This would use a sort of exchange tab or lead overlay geometry.

The MF material can be placed on top of the I_sense lead and the I_sense lead can be a soft magnetic material (FIG. 4). This allows a voltage to be applied between Write Line 1 and I_sense to lower the anisotropy of the MF material and a current through any combination of the lines can write the bit. Alternatively, a nonmagnetic I_sense lead can be used and the MF material, or the MF material coupled to another magnetic material, can be coupled to the FL through the I_sense lead via an indirect coupling (e.g., magnetostatic, Ruderman-Kittel-Kasuya-Yoshida (RKKY), or other known indirect coupling).

Using the multiferroic material can increase thermal/magnetic stability and lower power consumption. Multiple alternative geometries are disclosed to implement this concept. Many variations are possible, and adaptation of features described in one illustration for use in another illustration is contemplated. The optimum geometry used depends on the selected multiferroic material, processes selected, and the desired device performance. A synthetic permanent magnet adjacent the free layer. The synthetic permanent magnet can comprise a multiferroic layer coupled to a soft magnetic layer. The free layer can comprise a magnetically switchable layer. The multiferroic layer can couple to the free layer via RKKY coupling. Other variations are also possible.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the memory system while maintaining substantially the same functionality without departing from the scope and spirit of the present invention. In addition, although the preferred embodiment described herein is directed to a two dimensional array for memory cells, it will be appreciated by those skilled in the art that the teachings of the present invention can be applied to three dimensional arrays, without departing from the scope and spirit of the present invention.

What is claimed is:

1. A memory cell comprising:
   a magnetoresistive sensor that comprises layers that include a free layer, the magnetoresistive sensor conducting a read current representative of data stored in the memory cell during a read interval; and
   a first write conductor that carries a write current that writes data in the free layer; and the free layer comprises a multiferroic layer formed of multiferroic material.

2. The memory cell of claim 1 wherein the multiferroic layer receives a-modulation potential that modulates the magnetic anisotropy of the multiferroic material.

3. The memory cell of claim 2 wherein the modulation provides a lower magnetic anisotropy during a write interval.

4. The memory cell of claim 2 wherein the modulation provides a higher magnetic anisotropy during a read interval.

5. The memory cell of claim 1 and further comprising:
a second write conductor that produces a second write magnetic field that intersects the free layer during the write interval.

6. The memory cell of claim 5 wherein the first and second write magnetic fields add vectorially in at least one region of a tunnel junction.

7. The memory cell of claim 1 wherein the first write current flows though the magnetoresistive sensor.

8. The memory cell of claim 1 wherein the free layer comprises a non-volatile storage element.

9. The memory cell of claim 1 wherein the magnetoresistive sensor comprises a current-in-plane magnetoresistive sensor.

10. The memory cell of claim 1 wherein the magnetoresistive sensor comprises a current-perpendicular-to-plane magnetoresistive sensor.

11. The memory cell of claim 1 wherein the multiferroic material magnetically couples to a soft magnetic material to increase the magnetoresistance.

12. The memory cell of claim 1 and further comprising a synthetic permanent magnet adjacent the free layer.

13. The memory cell of claim 12 wherein the synthetic permanent magnet comprises a multiferroic layer coupled to a soft magnetic layer.

14. The memory cell of claim 1 where the free layer comprises a magnetically switchable layer.

15. The memory cell of claim 14 wherein the multiferroic layer couples to the magnetically switchable layer via RKKY coupling.

16. An array of memory cells, comprising:
row write conductors and column write conductors that cross at cross points;
memory cells positioned and addressable at the cross points; and
each memory cell comprising a magnetoresistive sensor comprising a free layer, each free layer comprising a layer of multiferroic material.

17. The array of claim 12 wherein the multiferroic material of an addressed memory cell receives a modulation potential that modulates a magnetic property of the multiferroic material.

18. The array of claim 16 wherein the modulated magnetic property comprises magnetic anisotropy.

19. The array of claim 17 wherein the modulation potential modulates a magnetic anisotropy of the multiferroic material.

20. The array of claim 17 wherein a write current flows through the magnetoresistive sensor of the addressed memory cell.

21. The array of claim 17 wherein write current does not flow through the magnetoresistive sensor of the addressed memory cell.

22. A method, comprising:
providing a magnetoresistive sensor that conducts a read current representative of data stored in the memory cell during a read interval;
providing a first write conductor that produces a first write magnetic field that intersects the magnetoresistive sensor during a write interval; and
forming at least one free layer comprising a multiferroic material.

23. The method of claim 22 wherein the multiferroic material is formed using thin film deposition.

24. The method of claim 22 wherein the multiferroic material is formed using a microstructure or nanostructure fabrication process.

* * * * *

UNITED STATES PATENT AND TRADEMARK OFFICE
CERTIFICATE OF CORRECTION

PATENT NO. : 7,656,700 B2  Page 1 of 1
APPLICATION NO. : 11/856217
DATED : February 2, 2010
INVENTOR(S) : Michael A. Siegler It is certified that error appears in the above-identified patent and that said Letters Patent is hereby corrected as shown below:

In Column 10 Line 6
Replace "of claim 12"
With "of claim 16"

Signed and Sealed this

Twentieth Day of April, 2010

David J. Kappos
*Director of the United States Patent and Trademark Office*